US009829523B1

(12) United States Patent
Peterson et al.

(10) Patent No.: US 9,829,523 B1
(45) Date of Patent: Nov. 28, 2017

(54) OFFSET SENSOR PATTERN

(71) Applicant: Cypress Semiconductor Corporation, San Jose, CA (US)

(72) Inventors: Jonathan R Peterson, Rochestown (IE); Cole D Wilson, Everett, WA (US); Patrick N Prendergast, Clinton, WA (US)

(73) Assignee: Cypress Semiconductor Corporation, San Jose, CA (US)

(*) Notice: Subject to any disclaimer, the term of this patent is extended or adjusted under 35 U.S.C. 154(b) by 97 days.

(21) Appl. No.: 14/137,426

(22) Filed: Dec. 20, 2013

Related U.S. Application Data

(60) Provisional application No. 61/746,444, filed on Dec. 27, 2012, provisional application No. 61/876,569, filed on Sep. 11, 2013.

(51) Int. Cl.
*G06F 3/044* (2006.01)
*G01R 27/26* (2006.01)
*G06F 3/047* (2006.01)
*G06F 1/16* (2006.01)
*G01R 1/02* (2006.01)

(52) U.S. Cl.
CPC ............ *G01R 27/2605* (2013.01); *G01R 1/02* (2013.01); *G06F 1/16* (2013.01); *G06F 3/044* (2013.01); *G06F 3/047* (2013.01)

(58) Field of Classification Search
CPC .......... G06F 3/044; G06F 2203/04111; G06F 3/0416; G06F 3/047; G06F 1/16; G06F 2203/04104; G06F 2203/04112; G01R 1/02; G01R 27/2605
USPC .................................................. 345/173–178
See application file for complete search history.

(56) References Cited

U.S. PATENT DOCUMENTS

| 7,864,160 | B2 | 1/2011 | Geaghan et al. |
| 8,004,499 | B2 | 8/2011 | Geaghan et al. |
| 8,154,529 | B2 | 4/2012 | Sleeman |
| 8,519,970 | B2 | 8/2013 | Westhues |
| 8,593,425 | B2 * | 11/2013 | Hong .................... G06F 3/0412 345/173 |

(Continued)

FOREIGN PATENT DOCUMENTS

WO    WO2013028599    2/2009

OTHER PUBLICATIONS

"TND6038—Touch Technology for Design and Application", Mar. 2013, Semiconductor Components Industries, LLC, Denver, CO, USA.

(Continued)

*Primary Examiner* — Jose Soto Lopez

(57) ABSTRACT

A capacitive sensor array may comprise a plurality of column sensor electrodes and a plurality of row sensor electrodes. The column sensor electrodes may be capacitively coupled with the row sensor electrodes to form a plurality of unit cells each including an intensity center identifying a location of greatest capacitance sensitivity between a row electrode and a column electrode. An axis of a set of row sensor electrodes may cross at least a portion of each row electrode in the set, and the intensity centers associated with the row electrodes in the set may be staggered on alternating sides of the axis. For each of the plurality of unit cells, a distance between the intensity center of the unit cell and a nearest intensity center of another unit cell at a perimeter of the unit cell may be at least 0.7 times the height of the unit cell.

12 Claims, 15 Drawing Sheets

(56) References Cited

U.S. PATENT DOCUMENTS

| | | | |
|---|---|---|---|
| 9,013,436 B2* | 4/2015 | Liu | G06F 3/047 345/173 |
| 9,063,621 B2* | 6/2015 | Kim | G06F 3/044 |
| 9,405,408 B2* | 8/2016 | Peng | G06F 3/044 |
| 2007/0074914 A1 | 4/2007 | Geaghan | |
| 2009/0159344 A1* | 6/2009 | Hotelling | G06F 3/047 178/18.06 |
| 2009/0273570 A1* | 11/2009 | Degner | G06F 3/044 345/173 |
| 2010/0007630 A1* | 1/2010 | Chang | 345/174 |
| 2010/0045632 A1* | 2/2010 | Yilmaz | G01D 5/2405 345/174 |
| 2010/0059294 A1* | 3/2010 | Elias | G06F 3/0416 178/18.06 |
| 2010/0097329 A1 | 4/2010 | Simmons | |
| 2010/0144391 A1 | 6/2010 | Chang | |
| 2010/0231555 A1* | 9/2010 | Mackey | G06F 3/044 345/174 |
| 2010/0289754 A1* | 11/2010 | Sleeman et al. | 345/173 |
| 2010/0302201 A1* | 12/2010 | Ritter | G06F 3/044 345/174 |
| 2011/0216038 A1 | 9/2011 | Stolov et al. | |
| 2011/0316567 A1* | 12/2011 | Chai | G06F 3/044 324/686 |
| 2012/0008063 A1* | 1/2012 | Asamizu | 349/61 |
| 2012/0090757 A1 | 4/2012 | Buchan | |
| 2012/0127114 A1 | 5/2012 | Weaver et al. | |
| 2012/0227259 A1* | 9/2012 | Badaye et al. | 29/846 |
| 2012/0262409 A1 | 10/2012 | Tsai et al. | |
| 2012/0262419 A1* | 10/2012 | Hershman | G06F 3/044 345/174 |
| 2012/0293453 A1 | 11/2012 | Yamada et al. | |
| 2013/0120303 A1* | 5/2013 | Hong | G06F 3/0412 345/173 |
| 2013/0127744 A1 | 5/2013 | Shakya | |
| 2013/0207911 A1 | 8/2013 | Barton | |

OTHER PUBLICATIONS

International Search Report and Written Opinion for International Application No. PCT/US13/77787 dated May 28, 2014, 7 pages.

* cited by examiner

OFFSET SENSOR PATTERN

RELATED APPLICATIONS

This application claims priority to U.S. Provisional Application No. 61/746,444, filed on Dec. 27, 2012, and to U.S. Provisional Application No. 61/876,569, filed on Sep. 11, 2013, both of which are incorporated by reference herein in their entirety.

TECHNICAL FIELD

This disclosure relates to the field of touch-sensors and, in particular, to capacitive touch-sensor arrays.

BACKGROUND

Computing devices, such as notebook computers, personal data assistants (PDAs), kiosks, and mobile handsets, have user interface devices, which are also known as human interface devices (HID). One user interface device that has become more common is a touch-sensor pad (also commonly referred to as a touchpad). A basic notebook computer touch-sensor pad emulates the function of a personal computer (PC) mouse. A touch-sensor pad is typically embedded into a PC notebook for built-in portability. A touch-sensor pad replicates mouse X/Y movement by using two defined axes which contain a collection of sensor electrodes that detect the position of one or more conductive objects, such as a finger. Mouse right/left button clicks can be replicated by two mechanical buttons, located in the vicinity of the touchpad, or by tapping commands on the touch-sensor pad itself. The touch-sensor pad provides a user interface device for performing such functions as positioning a pointer, or selecting an item on a display. These touch-sensor pads may include multi-dimensional sensor arrays for detecting movement in multiple axes. The sensor array may include a one-dimensional sensor array, detecting movement in one axis. The sensor array may also be two dimensional, detecting movements in two axes.

Another user interface device that has become more common is a touch screen. Touch screens, also known as touchscreens, touch windows, touch panels, or touchscreen panels, are transparent display overlays which are typically either pressure-sensitive (resistive or piezoelectric), electrically-sensitive (capacitive), acoustically-sensitive (surface acoustic wave (SAW)) or photo-sensitive (infra-red). The effect of such overlays allows a display to be used as an input device, removing the keyboard and/or the mouse as the primary input device for interacting with the display's content. Such displays can be attached to computers or, as terminals, to networks. Touch screens have become familiar in retail settings, on point-of-sale systems, on ATMs, on mobile handsets, on kiosks, on game consoles, and on PDAs where a stylus is sometimes used to manipulate the graphical user interface (GUI) and to enter data. A user can touch a touch screen or a touch-sensor pad to manipulate data. For example, a user can apply a single touch, by using a finger to touch the surface of a touch screen, to select an item from a menu.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in a simple block diagram format in order to avoid unnecessarily obscuring the present invention. Thus, the specific details set forth are merely exemplary. Particular implementations may vary from these exemplary details and still be contemplated to be within the spirit and scope of the present invention.

In one embodiment, an offset sensor pattern may be used to increase the resolution of a sensor array without decreasing the size of the sensor electrode features relative to a sensor pattern that is not offset. The offset sensor pattern may also result in a more uniform distribution of touch sensitivity over the sensing surface.

Figure 1:
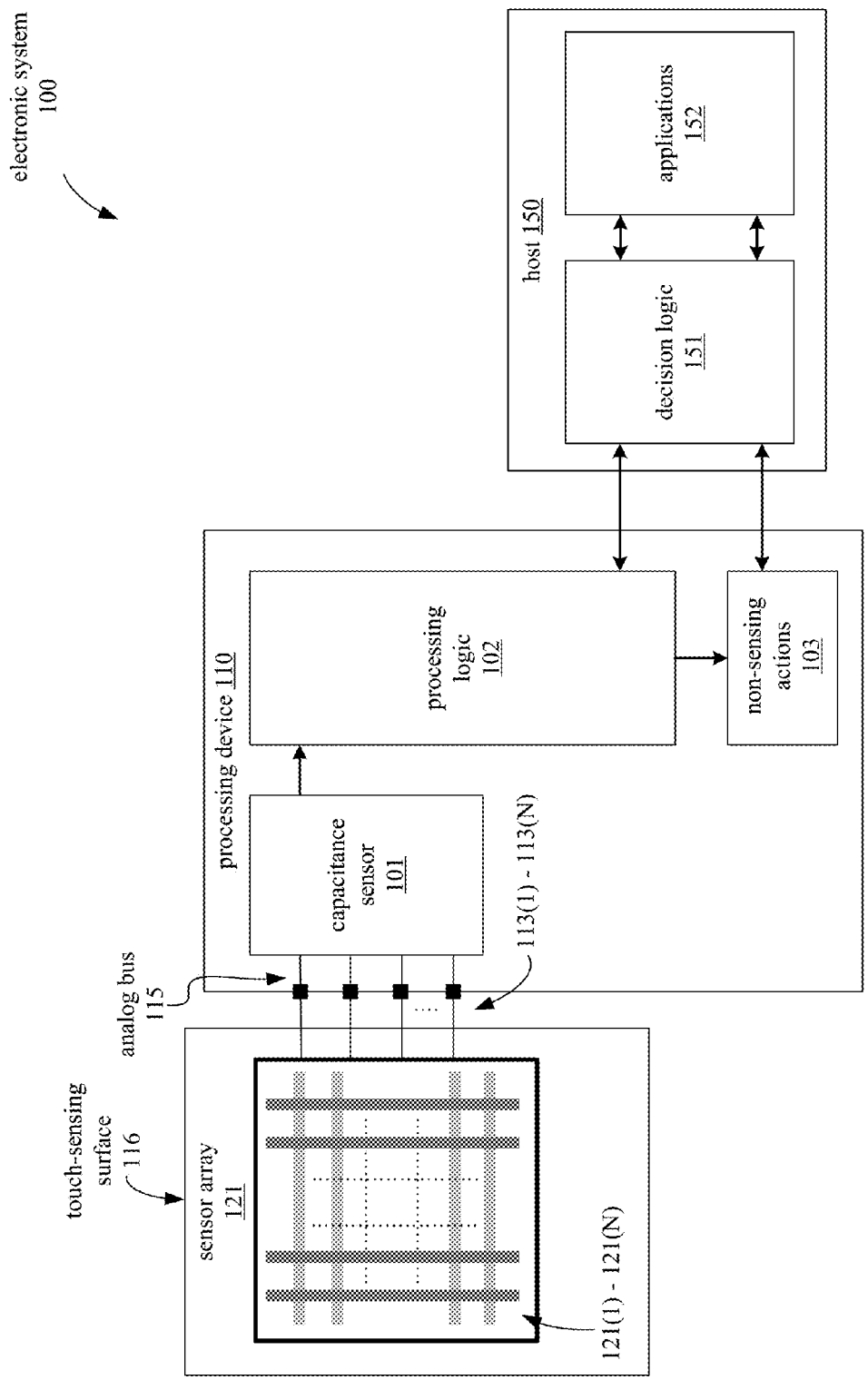
FIG. 1 is a block diagram illustrating an embodiment of an electronic system that processes touch sensor data.

FIG. 1 illustrates a block diagram of one embodiment of an electronic system 100 including a processing device 110 that may be configured to measure capacitances from a touch sensing surface 116 including a capacitive sensor array having an offset sensor pattern as described above. The electronic system 100 includes a touch-sensing surface 116 (e.g., a touchscreen, or a touch pad) coupled to the processing device 110 and a host 150. In one embodiment, the touch-sensing surface 116 is a two-dimensional user interface that uses a sensor array 121 to detect touches on the surface 116.

In one embodiment, the sensor array 121 includes sensor electrodes 121(1)-121(N) (where N is a positive integer) that are disposed as a two-dimensional matrix (also referred to as an XY matrix). The sensor array 121 is coupled to pins 113(1)-113(N) of the processing device 110 via one or more analog buses 115 transporting multiple signals. In this embodiment, each sensor electrode 121(1)-121(N) is represented as a capacitor.

In one embodiment, the capacitance sensor 101 may include a relaxation oscillator or other means to convert a capacitance into a measured value. The capacitance sensor 101 may also include a counter or timer to measure the oscillator output. The processing device 110 may further include software components to convert the count value (e.g., capacitance value) into a sensor electrode detection decision (also referred to as switch detection decision) or relative magnitude. It should be noted that there are various known methods for measuring capacitance, such as current versus voltage phase shift measurement, resistor-capacitor charge timing, capacitive bridge divider, charge transfer, successive approximation, sigma-delta modulators, charge-accumulation circuits, field effect, mutual capacitance, frequency shift, or other capacitance measurement algorithms. It should be noted however, instead of evaluating the raw counts relative to a threshold, the capacitance sensor 101 may be evaluating other measurements to determine the user interaction. For example, in the capacitance sensor 101 having a sigma-delta modulator, the capacitance sensor 101 is evaluating the ratio of pulse widths of the output, instead of the raw counts being over or under a certain threshold.

In one embodiment, the processing device 110 further includes processing logic 102. Operations of the processing logic 102 may be implemented in firmware; alternatively, it may be implemented in hardware or software. The processing logic 102 may receive signals from the capacitance sensor 101, and determine the state of the sensor array 121, such as whether an object (e.g., a finger) is detected on or in proximity to the sensor array 121 (e.g., determining the presence of the object), where the object is detected on the sensor array (e.g., determining the location of the object), tracking the motion of the object, or other information related to an object detected at the touch sensor.

In another embodiment, instead of performing the operations of the processing logic 102 in the processing device 110, the processing device 110 may send the raw data or partially-processed data to the host 150. The host 150, as illustrated in FIG. 1, may include decision logic 151 that performs some or all of the operations of the processing logic 102. Operations of the decision logic 151 may be implemented in firmware, hardware, software, or a combination thereof. The host 150 may include a high-level Application Programming Interface (API) in applications 152 that perform routines on the received data, such as compensating for sensitivity differences, other compensation algorithms, baseline update routines, start-up and/or initialization routines, interpolation operations, or scaling operations. The operations described with respect to the processing logic 102 may be implemented in the decision logic 151, the applications 152, or in other hardware, software, and/or firmware external to the processing device 110. In some other embodiments, the processing device 110 is the host 150.

In another embodiment, the processing device 110 may also include a non-sensing actions block 103. This block 103 may be used to process and/or receive/transmit data to and from the host 150. For example, additional components may be implemented to operate with the processing device 110 along with the sensor array 121 (e.g., keyboard, keypad, mouse, trackball, LEDs, displays, or other peripheral devices).

The processing device 110 may reside on a common carrier substrate such as, for example, an integrated circuit (IC) die substrate, or a multi-chip module substrate. Alternatively, the components of the processing device 110 may be one or more separate integrated circuits and/or discrete components. In one embodiment, the processing device 110 may be the Programmable System on a Chip (PSoC™) processing device, developed by Cypress Semiconductor Corporation, San Jose, Calif. Alternatively, the processing device 110 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or other programmable device. In an alternative embodiment, for example, the processing device 110 may be a network processor having multiple processors including a core unit and multiple micro-engines. Additionally, the processing device 110 may include any combination of general-purpose processing device(s) and special-purpose processing device(s).

In one embodiment, the electronic system 100 is implemented in a device that includes the touch-sensing surface 116 as the user interface, such as handheld electronics, portable telephones, cellular telephones, notebook computers, personal computers, personal data assistants (PDAs), kiosks, keyboards, televisions, remote controls, monitors, handheld multi-media devices, handheld video players, gaming devices, control panels of a household or industrial appliances, or other computer peripheral or input devices. Alternatively, the electronic system 100 may be used in other types of devices. It should be noted that the components of electronic system 100 may include all the components described above. Alternatively, electronic system 100 may include only some of the components described above, or include additional components not listed herein.

Figure 2:
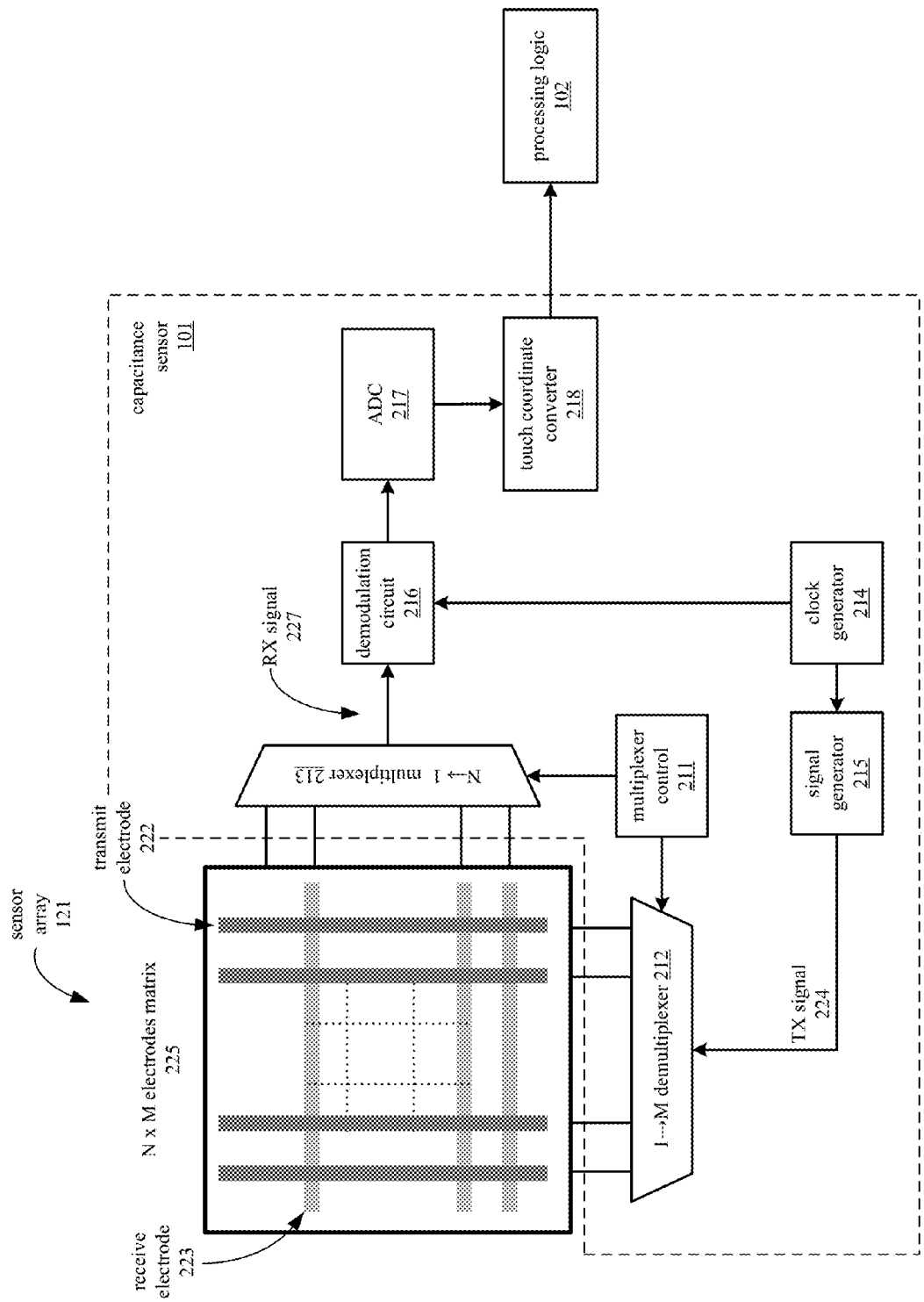
FIG. 2 is a block diagram illustrating an embodiment of an electronic system that processes touch sensor data.

FIG. 2 is a block diagram illustrating one embodiment of a capacitive touch sensor array 121 and a capacitance sensor 101 that converts changes in measured capacitances to coordinates indicating the presence and location of touch. The coordinates are calculated based on changes in measured capacitances relative to the capacitances of the same touch sensor array 121 in an un-touched state. In one embodiment, sensor array 121 and capacitance sensor 101 are implemented in a system such as electronic system 100. Sensor array 220 includes a matrix 225 of N×M electrodes (N receive electrodes and M transmit electrodes), which further includes transmit (TX) electrode 222 and receive (RX) electrode 223. Each of the electrodes in matrix 225 is connected with capacitance sensing circuit 201 through demultiplexer 212 and multiplexer 213.

Capacitance sensor 101 includes multiplexer control 211, demultiplexer 212 and multiplexer 213, clock generator 214, signal generator 215, demodulation circuit 216, and analog to digital converter (ADC) 217. ADC 217 is further coupled with touch coordinate converter 218. Touch coordinate converter 218 may be implemented in the processing logic 102.

The transmit and receive electrodes in the electrode matrix 225 may be arranged so that each of the transmit electrodes overlap and cross each of the receive electrodes such as to form an array of intersections, while maintaining galvanic isolation from each other. Thus, each transmit electrode may be capacitively coupled with each of the receive electrodes. For example, transmit electrode 222 is capacitively coupled with receive electrode 223 at the point where transmit electrode 222 and receive electrode 223 overlap.

Clock generator 214 supplies a clock signal to signal generator 215, which produces a TX signal 224 to be supplied to the transmit electrodes of touch sensor 121. In one embodiment, the signal generator 215 includes a set of switches that operate according to the clock signal from clock generator 214. The switches may generate a TX signal 224 by periodically connecting the output of signal generator 215 to a first voltage and then to a second voltage, wherein said first and second voltages are different.

The output of signal generator 215 is connected with demultiplexer 212, which allows the TX signal 224 to be applied to any of the M transmit electrodes of touch sensor 121. In one embodiment, multiplexer control 211 controls demultiplexer 212 so that the TX signal 224 is applied to each transmit electrode 222 in a controlled sequence. Demultiplexer 212 may also be used to ground, float, or connect an alternate signal to the other transmit electrodes to which the TX signal 224 is not currently being applied. In an alternate embodiment the TX signal 224 may be presented in a true form to a subset of the transmit electrodes 222 and in complement form to a second subset of the transmit electrodes 222, wherein there is no overlap in members of the first and second subset of transmit electrodes 222.

Because of the capacitive coupling between the transmit and receive electrodes, the TX signal 224 applied to each transmit electrode induces a current within each of the receive electrodes. For instance, when the TX signal 224 is applied to transmit electrode 222 through demultiplexer 212, the TX signal 224 induces an RX signal 227 on the receive electrodes in matrix 225. The RX signal 227 on each of the receive electrodes can then be measured in sequence by using multiplexer 213 to connect each of the N receive electrodes to demodulation circuit 216 in sequence.

The mutual capacitance associated with each intersection between a TX electrode and an RX electrode can be sensed by selecting every available combination of TX electrode and an RX electrode using demultiplexer 212 and multiplexer 213. To improve performance, multiplexer 213 may also be segmented to allow more than one of the receive electrodes in matrix 225 to be routed to additional demodulation circuits 216. In an optimized configuration, wherein there is a 1-to-1 correspondence of instances of demodulation circuit 216 with receive electrodes, multiplexer 213 may not be present in the system.

When an object, such as a finger, approaches the electrode matrix 225, the object causes a change in the measured mutual capacitance between only some of the electrodes. For example, if a finger is placed near the intersection of transmit electrode 222 and receive electrode 223, the presence of the finger will decrease the charge coupled between electrodes 222 and 223. Thus, the location of the finger on the touchpad can be determined by identifying the one or more receive electrodes having a decrease in measured mutual capacitance in addition to identifying the transmit electrode to which the TX signal 224 was applied at the time the decrease in capacitance was measured on the one or more receive electrodes.

By determining the mutual capacitances associated with each intersection of electrodes in the matrix 225, the presence and locations of one or more conductive objects may be determined. The determination may be sequential, in parallel, or may occur more frequently at commonly used electrodes.

In alternative embodiments, other methods for detecting the presence of a finger or other conductive object may be used where the finger or conductive object causes an increase in measured capacitance at one or more electrodes, which may be arranged in a grid or other pattern. For example, a finger placed near an electrode of a capacitive sensor may introduce an additional capacitance to ground that increases the total capacitance between the electrode and ground. The location of the finger can be determined based on the locations of one or more electrodes at which a change in measured capacitance is detected.

The induced current signal 227 is integrated by demodulation circuit 216. The rectified current output by demodulation circuit 216 can then be filtered and converted to a digital code by ADC 217.

A series of such digital codes measured from adjacent sensor or intersections may be converted to touch coordinates indicating a position of an input on touch sensor array 121 by touch coordinate converter 218. The touch coordinates may then be used to detect gestures or perform other functions by the processing logic 102.

In one embodiment, the capacitance sensor 101 can be configured to detect multiple touches. One technique for the detection and location resolution of multiple touches uses a two-axis implementation: one axis to support rows and another axis to support columns. Additional axes, such as a diagonal axis, implemented on the surface using additional layers, can allow resolution of additional touches.

Figure 3A:
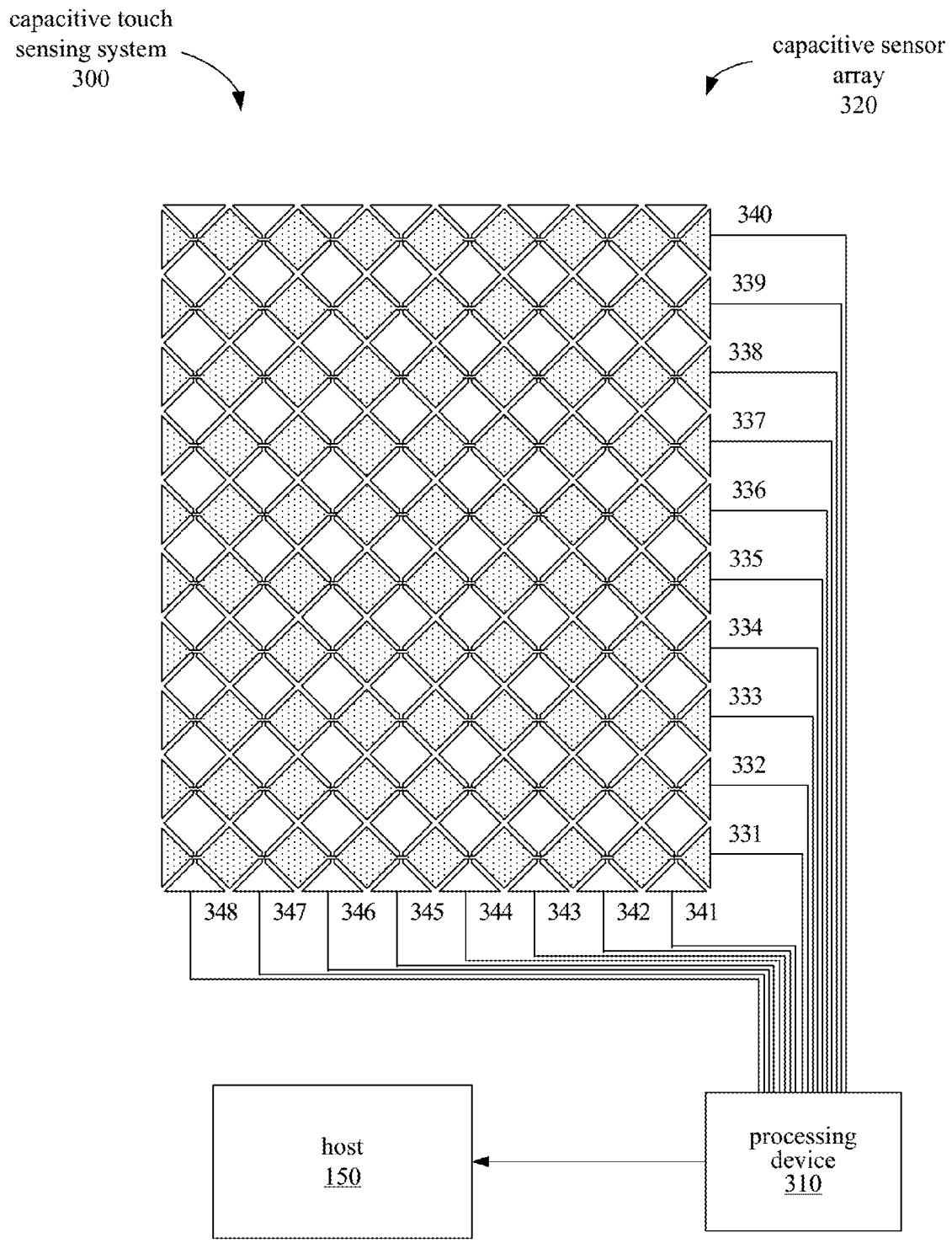
FIG. 3A illustrates an embodiment of an electronic touch-sensing system using a dual solid diamond capacitive sensor pattern.

FIG. 3A illustrates an embodiment of a capacitive touch sensing system 300 that includes a capacitive sensor array 320. Capacitive sensor array 320 includes a plurality of row sensor electrodes 331-340 and a plurality of column sensor electrodes 341-348. The row and column sensor electrodes 331-348 are connected to a processing device 310, which may include the functionality of capacitance sensor 101, as illustrated in FIG. 2. In one embodiment, the processing device 310 may perform TX-RX scans of the capacitive sensor array 320 to measure a mutual capacitance value associated with each of the intersections between a row sensor electrode and a column sensor electrode in the sensor array 320. The measured capacitances may be further processed to determine higher resolution locations of one or more contacts at the capacitive sensor array 320.

In one embodiment, the processing device 310 is connected to a host 150 which may receive the measured capacitances or calculate high precision locations from the processing device 310.

Figure 3B:
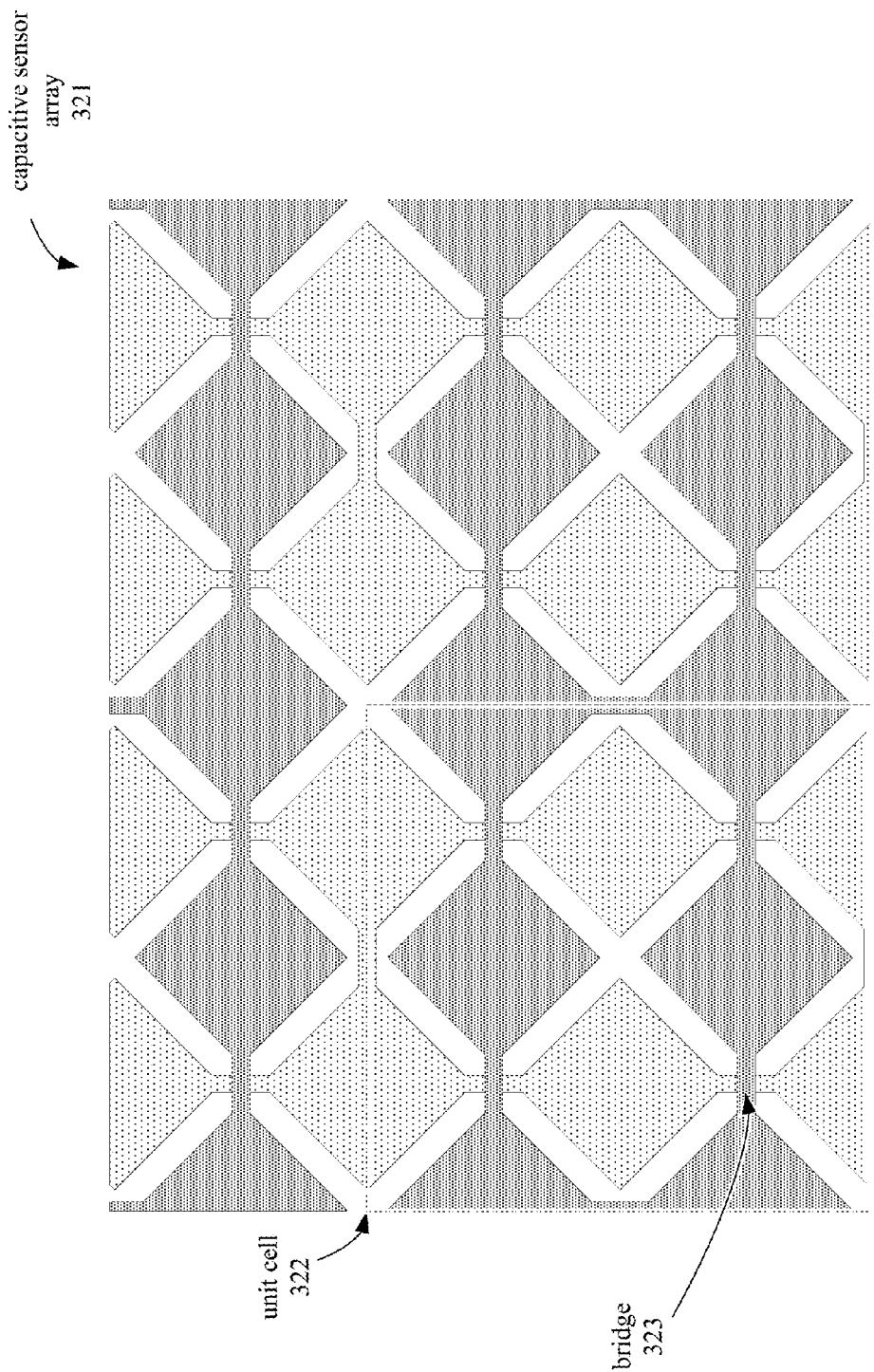
FIG. 3B illustrates an embodiment of a dual solid diamond capacitive sensor pattern.

The sensor array 320 illustrated in FIG. 3A includes sensor electrodes arranged in a diamond pattern. Specifically, the sensor electrodes 331-348 of sensor array 320 are arranged in a single solid diamond (SSD) pattern. FIG. 3B illustrates a capacitive sensor array 321 having an alternate embodiment of the diamond pattern, which is the dual solid diamond (DSD) pattern. Each of the sensor electrodes of capacitive sensor array 321 includes two rows or columns of electrically connected diamond shaped traces. Relative to the SSD pattern, the DSD pattern has improved signal disparity characteristics due to an increase in the coupling between TX and RX sensor electrodes while maintaining the same self-capacitance coupling possible between each sensor electrode and a conductive object near the sensor electrode. The DSD pattern may also provide higher sensitivity for tracking smaller objects, such as the point of a stylus, as compared to patterns having larger features, such as SSD.

However, the DSD pattern also increases the number of bridges (such as bridge 323) used to create the pattern, which may result in decreased manufacturing yield. The increased number of bridges may also be visible if metal bridges are used. For example, sensor array 321 includes four bridges within unit cell 322.

Figure 4A:
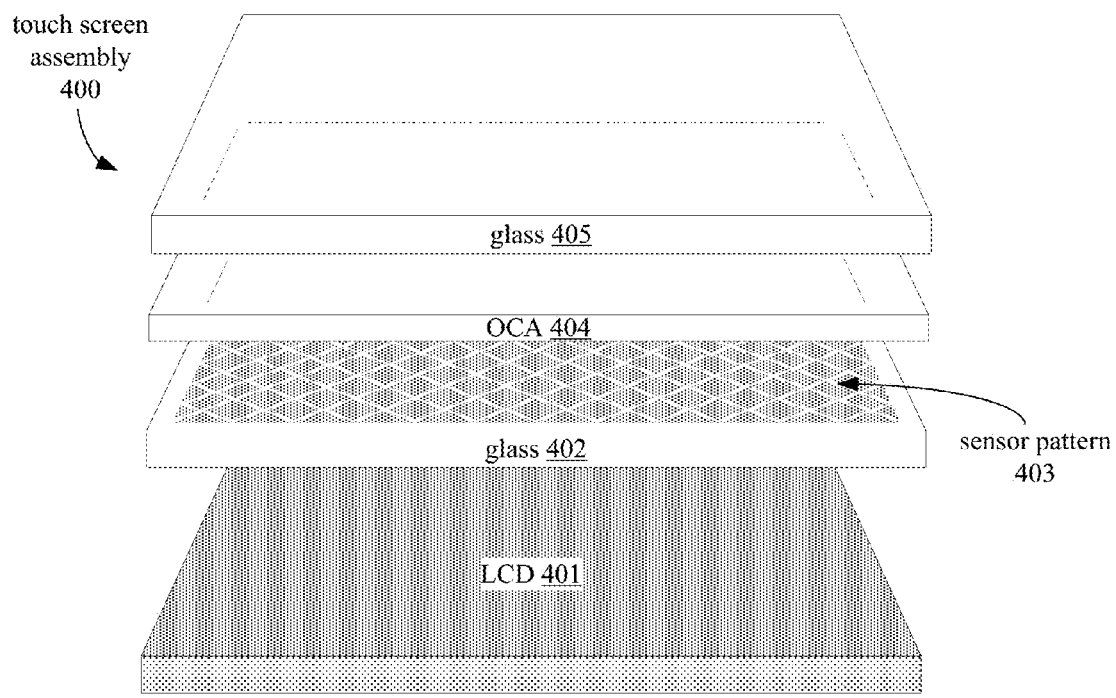
FIGS. 4A and 4B illustrate embodiments of touch screen assemblies.
Figure 4B:
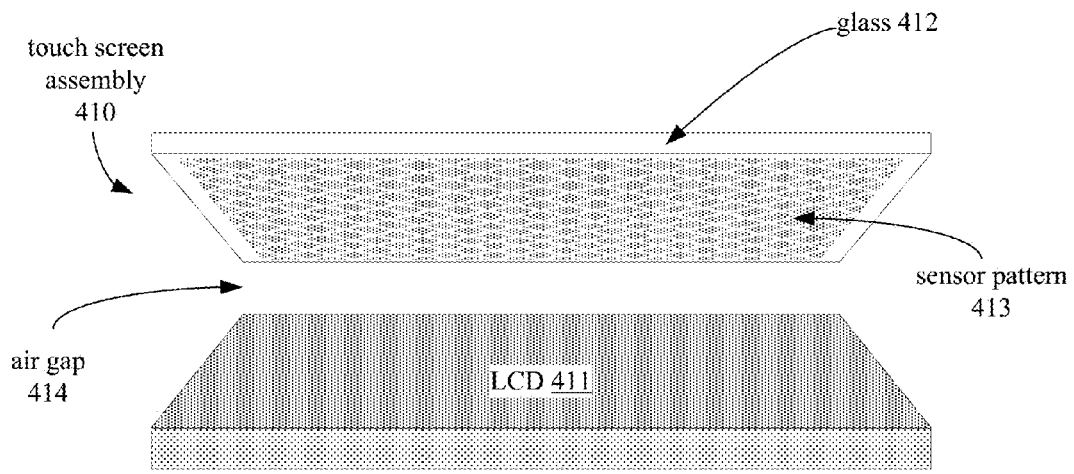

FIGS. 4A and 4B illustrate embodiments of touch screen assemblies 400 and 410, respectively, that include capacitive sensor arrays. Touch screen assembly 400 includes a liquid crystal display (LCD) 401 over which glass 402 is laid. A sensor pattern 403 is constructed on the surface of glass 402. In one embodiment, the sensor pattern 403 is constructed on the surface of glass 402 that faces away from the LCD 401. Optically clear adhesive (OCA) 404 may be used to bond glass 405 to the surface of glass 402 on which the sensor pattern 403 is constructed, thus protecting the sensor pattern 403. The sensor pattern 403 may be a SSD pattern, a DSD pattern, or another pattern as described in the following figures.

Touch screen assembly 410 includes an LCD 411, over which a glass 412 may be positioned. In one embodiment, sensor pattern 413 may be constructed on the surface of glass 412 that faces the LCD 411. In one embodiment, an air gap 414 may separate the glass 412 from the LCD 411.

In one embodiment, a capacitive sensor pattern such as the SSD pattern, DSD pattern, or other capacitive sensor pattern described herein may include row and column sensor electrodes that can be expressed as a matrix of the intersections between the row and column electrodes. Resolution of these sensor arrays may be represented as the product of the number of columns and the number of rows. For example, for a sensor array with N row electrodes and M column electrodes, the number of intersections would be N×M.

Figure 5A:
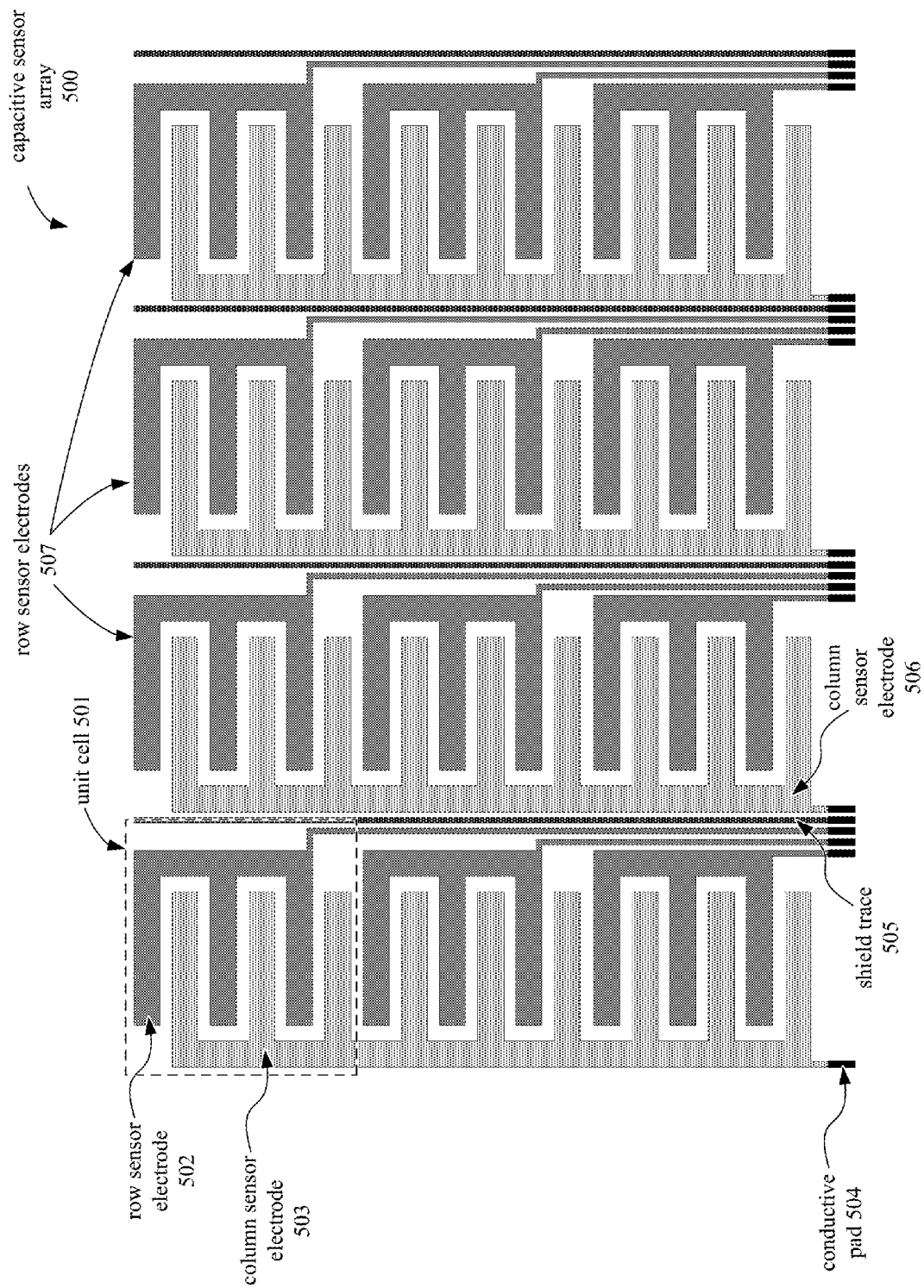
FIG. 5A illustrates an embodiment of a capacitive sensor array.

FIG. 5A illustrates an embodiment of a capacitive sensor array 500 that includes multiple column sensor electrodes and multiple row sensor electrodes constructed from a single layer of conductive material. For a single-layer sensor array pattern, the pattern may include a single layer of copper, indium-tin oxide (ITO), or other conductive material without any overlapping portions. In one embodiment, such a single layer of conductive material may include different types of conductive materials. For example, part of the single layer may be constructed from ITO while another part may be constructed from copper. In one embodiment, the single layer of conductive material may lie substantially on a single plane or surface such that the components of the sensor pattern are substantially coplanar. For example, the single layer of conductive material may conform to the surface of a substrate such as glass or plastic.

The capacitive sensor array 500 includes a number of row sensor electrodes which can be divided into multiple sets of row sensor electrodes. For example, the row sensor electrode 502 is in the same set as row sensor electrodes 507. In one embodiment, sensor electrodes in the same set are aligned along a horizontal axis, and may be electrically coupled together and may function as a single electrode when a capacitance sensor performs a capacitance measurement scan of the row sensor electrodes. Alternatively, the row sensor electrodes in the same set may be disconnected from each other and sensed separately. In one embodiment, a medial longitudinal axis drawn through the set of row electrodes as a whole passes through at least part of each of the row electrodes the set. In one embodiment, the longitudinal axis of each set of row sensor electrodes in the capacitive sensor array 500 is substantially perpendicular to a longitudinal axis of at least one of the plurality of column sensor electrodes.

In one embodiment, shield traces such as shield trace 505 may be included in the capacitive sensor array 500 to reduce crosstalk between certain row and column sensor electrode pairs. For example, shield trace 505 is located between a routing trace of row sensor electrode 502 and column sensor electrode 506 to reduce capacitive coupling between the electrodes 502 and 506.

In one embodiment, each of the row sensor electrodes and column sensor electrodes in the sensor array 500 may be electrically connected to a conductive pad outside the active sensing region of the sensor array 500. For example, column sensor electrode 503 is electrically connected to a conductive pad 504. In one embodiment, such conductive pads may be used to further connect the sensor array 500 to a capacitance sensor 101 so that the capacitance sensor 101 may measure capacitances between the row and column sensor electrodes.

In one embodiment, the active sensing region over which changes in capacitance may be detected is divisible into a grid of unit cells, such as unit cell 501. Each of these unit cells may contain a sensing region corresponding to a particular pairing between a row sensor electrode and a column sensor electrode. For example, the unit cell 501 contains the sensing region between row sensor electrode 502 and column sensor electrode 503. In other words, the presence of a conductive object within unit cell 501 influences the mutual capacitance between row sensor electrode 502 and column sensor electrode 503 more than the presence of the conductive object influences any mutual capacitance between any other pair of row and column sensor electrodes.

Figure 5B:
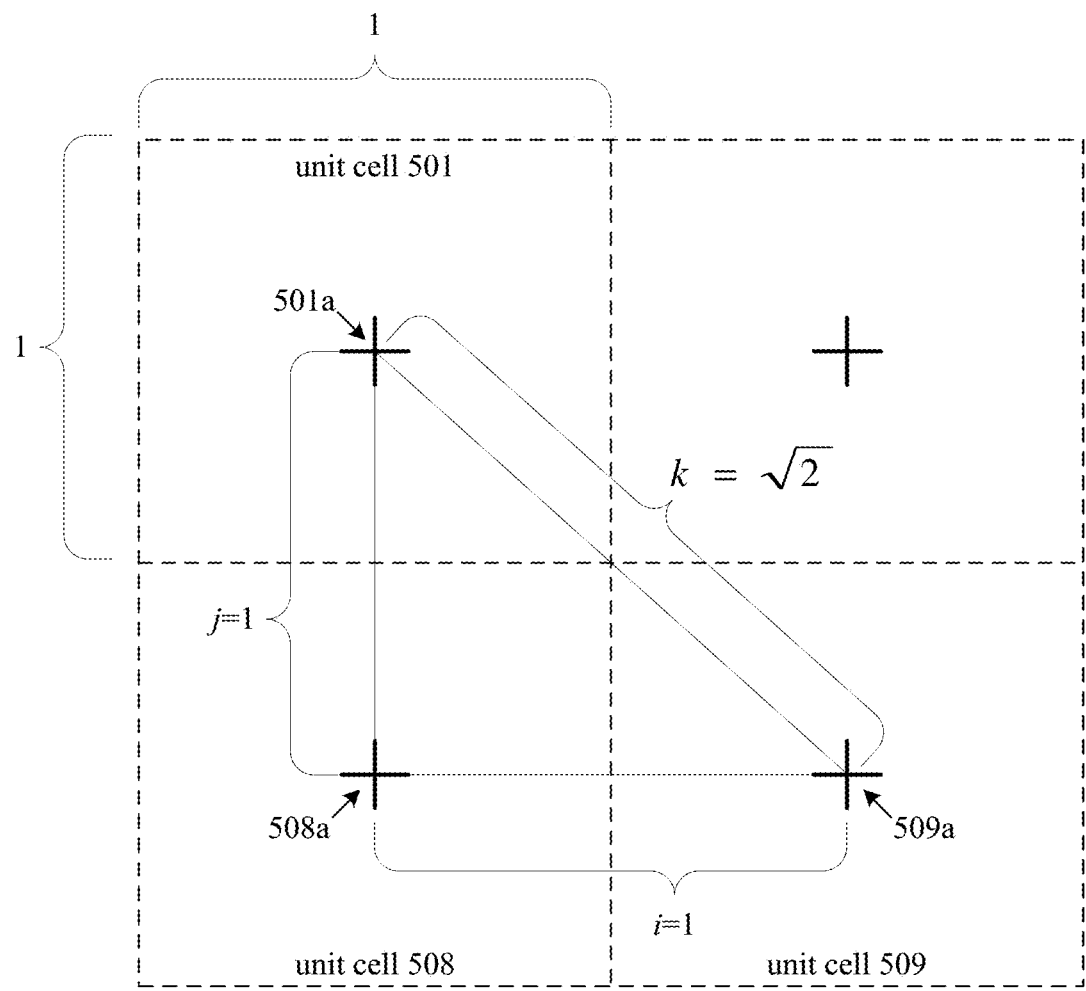
FIG. 5B illustrates dimensions of unit cells of a capacitive sensor array, according to an embodiment.

FIG. 5B illustrates an arrangement of unit cells corresponding to the row and sensor electrodes in the capacitive sensor array 500, according to one embodiment. In one embodiment, each of the unit cells includes a high touch intensity center that identifies a location of greatest capacitance sensitivity between the row electrode and the column electrode associated with the unit cell. For example, unit cells 501, 508, and 509 have intensity centers 501a, 508a, and 509a. While most or all of the unit cell may be sensitive to changes in capacitance caused by a proximate conductive object, the high touch intensity center may indicate a single point that is the most sensitive, such that a conductive object at that point would cause a greater change in capacitance between the row and column sensor element than at any other point in the unit cell.

In one embodiment, the intensity center of the unit cell may be determined empirically, by simulation, or by otherwise calculating the location based on the geometries of the row and column sensor electrodes, for example. In one embodiment, the intensity center of the unit cell is located substantially at a centroid location of the unit cell.

FIG. 5B illustrates the relative proportions of the features of the unit cells 501, 508, and 509. Since the unit cells 501, 508, and 509 are square, their heights and widths are equal. For ease of explanation, each unit cell is illustrated as being 1 unit high and 1 unit wide, where a unit may be assigned an arbitrary length. Thus, the distance j between the intensity center 501a and the intensity center 508a is substantially equal to 1. However, the distance k between the intensity center 501a and the intensity center 509a is substantially equal to $\sqrt{2}$ units. Accordingly, the distances between the respective intensity centers of these unit cells are significantly different. Additionally, the non-uniform spacing of the intensity centers results in areas of low touch intensity, such as the location at which the four corners of the illustrated unit cells meet.

Figure 6A:
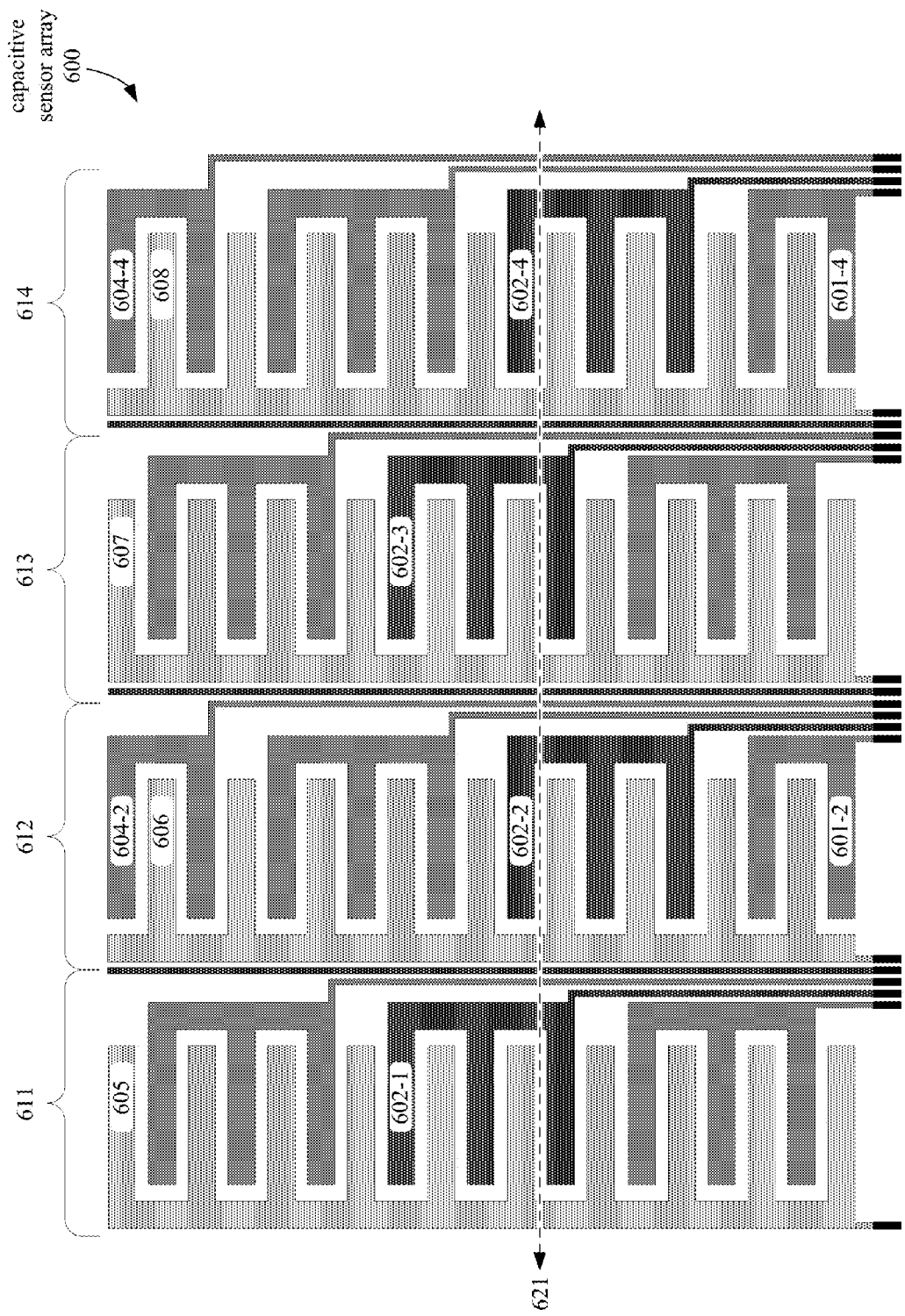
FIG. 6A illustrates an embodiment of a capacitive sensor array having an offset cell pattern.

FIG. 6A illustrates a capacitive sensor array 600 having offset columns, according to one embodiment. As illustrated in FIG. 6A, the sensor pattern in the columns 612 and 614 are offset relative to the corresponding features in the sensor pattern in columns 611 and 613. The offset decreases the maximum distance between intensity centers, resulting in an effective pitch that is smaller than the actual physical pitch of the unit cells, and additionally resulting in a more uniform distribution of sensitivity over the surface of the sensor array.

In the capacitive sensor array 600, each of the column electrodes 605-608 is capacitively coupled with at least one of the row sensor electrodes from each set of row sensor electrodes to form a unit cell for each unique pairing of a row sensor electrode with a column sensor electrode. For example, each of the column sensor electrodes 605-608 is capacitively coupled with at least one of the row sensor electrodes 602, which are in the same set of row sensor electrodes.

In one embodiment, row and column electrodes of the capacitive sensor array 600 may be formed from a single layer of substantially co-planar conductive material. As illustrated in FIG. 6A, each of the column sensor electrodes 611-614 may include multiple subtraces interleaved with subtraces of the row sensor electrodes to which the column sensor electrode is capacitively coupled.

In one embodiment, for each set of row sensor electrodes in the same set, a medial longitudinal axis crosses at least a portion of each of the row sensor electrodes in the set. For example, the medial longitudinal axis 621 crosses a portion of each of the row sensor electrodes 602-1, 602-2, 602-3, and 602-4. In one embodiment, these row sensor electrodes 602 in the same set may be coupled together during a capacitance sensing operation; alternatively, the row sensor electrodes 602 may be disconnected so that capacitances for each of the electrodes 602 may be measured independently. In one embodiment, the longitudinal axis of each set of row sensor electrodes in the capacitive sensor array 600 is substantially perpendicular to a longitudinal axis of at least one of the plurality of column sensor electrodes.

In one embodiment, a capacitance sensing system 100 may include a capacitance sensor 101 that is coupled with each of the row sensor electrodes, such as electrodes 602, and column sensor electrodes 611-614 of the sensor array 600 so that the capacitance sensor 101 may measure a self-capacitance of the electrodes or may, for each unit cell, measure a mutual capacitance between the row sensor electrode and the column sensor electrode associated with the unit cell.

Each of the unit cells of the sensor array 600 is associated with a unique pairing of a row sensor electrode and a column electrode. Accordingly, each point within the unit cell is nearer to a boundary between the row sensor electrode and the column sensor electrode of the unique pairing than to a boundary between any other pairing of a row sensor electrode and a column sensor electrode. The unit cell thus designates the area within which the mutual capacitance between the associated pair of electrodes is more sensitive to the presence of a conductive object than any other mutual capacitance between a different pairing of electrodes.

Figure 6B:
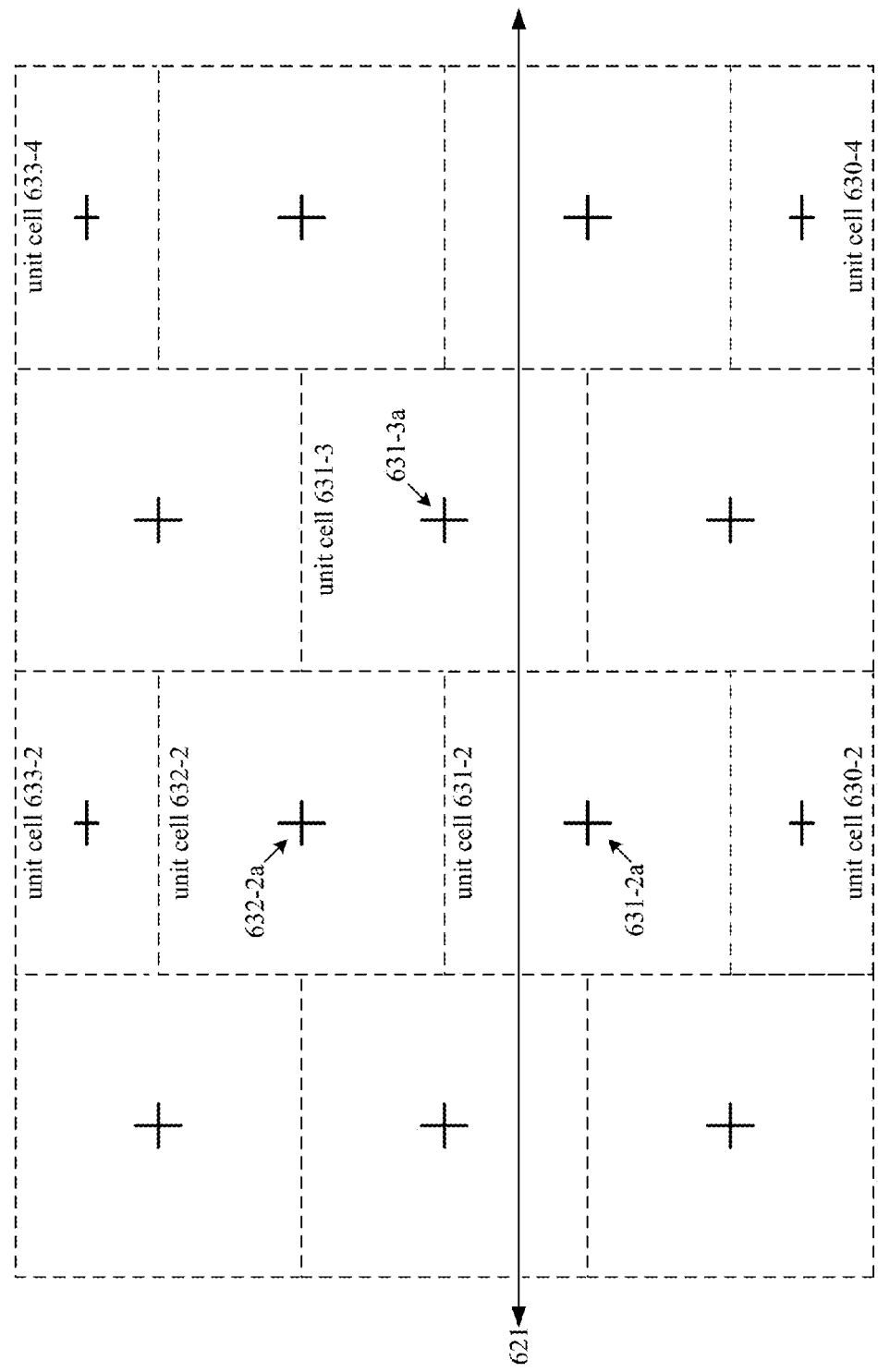
FIG. 6B illustrates a layout of unit cells for a capacitive sensor array having an offset cell pattern, according to an embodiment.

FIG. 6B illustrates an arrangement of unit cells corresponding to the row and sensor electrodes in the capacitive sensor array 600, according to one embodiment. In one embodiment, each of the unit cells includes a high touch intensity center that identifies a location of greatest capacitance sensitivity between the row electrode and the column electrode associated with the unit cell. For example, unit cells 631-2, 631-3, and 632-2 have intensity centers 631-2a, 631-3a, and 632-2a. In one embodiment, the intensity center of each unit cell is located substantially at a centroid location of the unit cell.

In one embodiment, the intensity centers of the same set of row sensor electrodes are staggered on alternating sides of a medial longitudinal axis of the set of row sensor electrodes. For example, the intensity centers 631-2a and 631-3a are staggered on alternating sides of the axis 621.

In one embodiment, the capacitive sensor array 600 includes one or more unit cells located at the edges that are smaller than any of the unit cells not located at the edges of the sensor array 600. For example, unit cells 630-2 and 630-4 at the bottom edge of the sensor array 600 and unit cells 633-2 and 633-4 at the top edge of the sensor array 600, as illustrated, are smaller than any of the other unit cells, such as 632-2 and 631-3, that are not located at an edge of the sensor array 600. In one embodiment, the smaller edge unit cells 633-2, 633-4, 630-2, and 630-4 correspond to smaller sensor electrodes 604-2, 604-4, 601-2, and 601-4, at the edges of the sensor array 600. In one embodiment, these smaller sensor electrodes are included so that the edges of the sensor array 600 are straight, and so that the active sensing area of the array 600 extends to the edge of the array 600 for all columns.

Figure 6C:
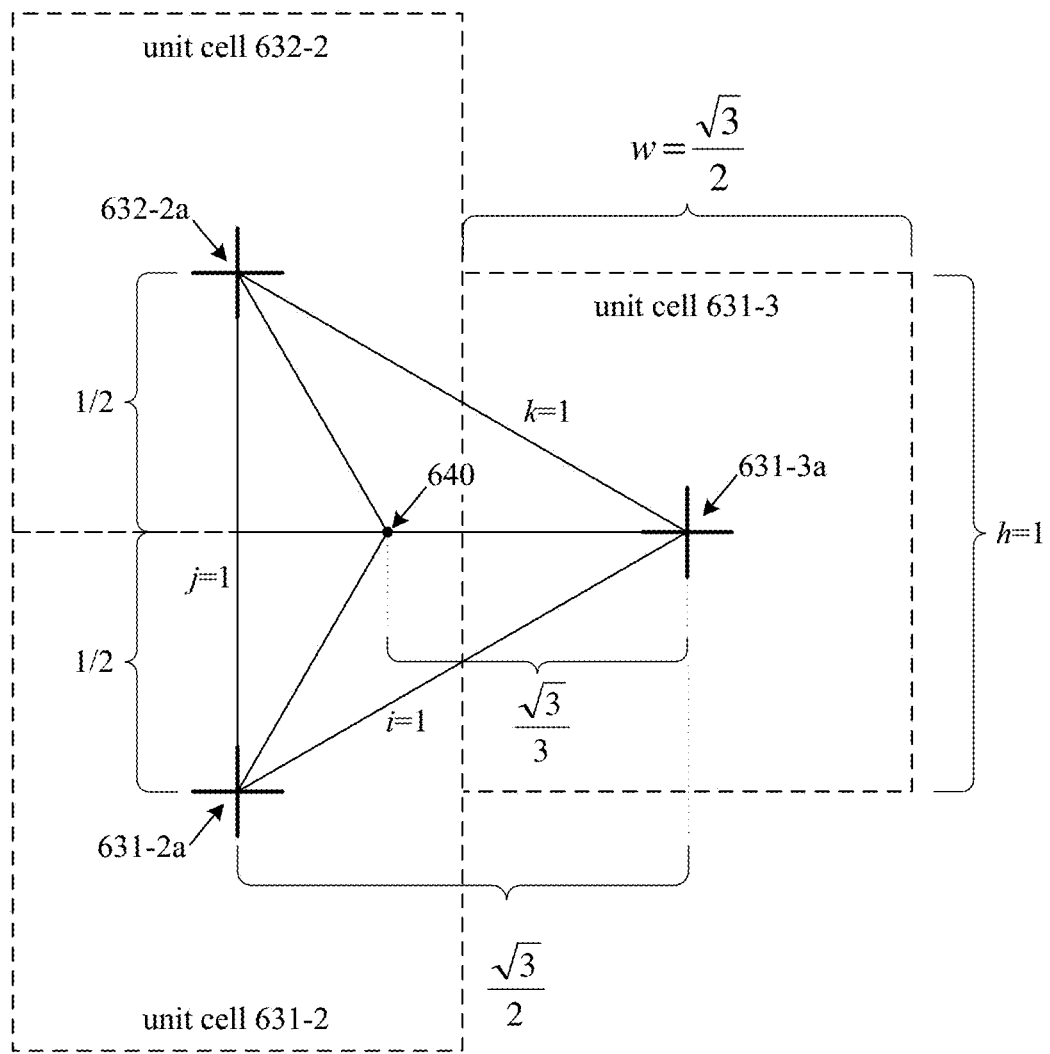
FIG. 6C illustrates dimensions of offset unit cells of a capacitive sensor array, according to an embodiment.

FIG. 6C illustrates the relative proportions of the features of the unit cells 631-2, 631-3, and 632-2, according to one embodiment. For ease of explanation, each unit cell is illustrated as being 1 unit high, where a unit can be assigned an arbitrary length. In one embodiment, the unit cell 631-3 is offset relative to the adjacent unit cell 631-2 in the same row such that the component of the offset in the same direction as a longitudinal axis of the column electrode is approximately one half of the height of the unit cell.

In one embodiment, with regard to the intensity centers, the intensity center 631-3a is offset relative to one of the nearest intensity centers 632-2a of a unit cell of an adjacent column sensor electrode. The component of the offset in a direction along a longitudinal axis of the column sensor electrode is substantially equal to half the height of the unit cell, in one embodiment. In alternative embodiments, the offset may be more or less than half the height of the unit cell.

In one embodiment of a capacitive sensor array, for each unit cell, a distance between the intensity center of the unit cell and the nearest intensity center of a perimeter unit cell may at least 0.7 times the height of the unit cell. Here, a perimeter unit cell may be defined as another unit cell that is located at the perimeter of the original unit cell such that a line can be drawn from a point in the original unit cell to a point in the perimeter unit cell without crossing any other unit cell. In addition, the width of the unit cell as referenced above may be measured in the direction of a longitudinal axis of the column sensor electrode of the original unit cell.

As an example, for a capacitive sensor array having a unit cell height h and width w of 2 units and 1 unit, respectively:

$$h = 2, w = 1, \text{ therefore } j = 2$$

$$k = \sqrt{\left(\frac{j}{2}\right)^2 + w^2}$$

$$k = \sqrt{1^2 + 1^2} = \sqrt{2}$$

$$k/h = \frac{\sqrt{2}}{2}$$

Thus, the ratio of k:h is approximately equal to 0.707, which is at least 0.7. Accordingly, the distance k between intensity centers is at least 0.7 times the height h of the unit cell.

In one embodiment, the offset unit cells allows the effective pitch of the sensor array to be increased, relative to a non-offset pattern having the same unit cell dimensions. Alternatively, an offset pattern may have smaller unit cell dimensions while maintaining a similar effective pitch, relative to a non-offset pattern. In one embodiment, the additional space made available by the smaller unit cell dimensions may be used for routing traces, shield traces, or other sensor features.

In one embodiment, a capacitive sensor array may include unit cells for which the largest possible ratio j:k is less than 1.5, where j represents distance between the intensity center of the unit cell and an intensity center of a first other unit cell at the perimeter of the unit cell, and k represents a distance between the intensity center of the unit cell and a second intensity center of a second other unit cell that is also at the perimeter of the unit cell and that is adjacent to the first other unit cell.

One embodiment of such a capacitive sensor array includes unit cells having a height-to-width ratio of 2:1. Accordingly, the ratio j:k may be in a prescribed range between 1 and 1.5 as follows:

$$h = 2, \text{ therefore } w = 1 \text{ and } j = 2$$

$$k = \sqrt{\left(\frac{j}{2}\right)^2 + w^2}$$

$$k = \sqrt{1^2 + 1^2} = \sqrt{2}$$

$$j/k = 2/\sqrt{2}$$

Thus, the ratio of j:k is approximately 1.414, which is within the prescribed range. In one embodiment of a capacitive sensor array, the ratio j:k may be as low as approximately 1, such that the distances j and k are approximately equal.

In one embodiment, the width of the unit cell is approximately $\sqrt{3}/2$ times the height of the unit cell, such that when the above-described offset is one half the height of the unit cell, the distances between the intensity centers are equal. Thus, the distance i between intensity centers 631-2a and 632-2a, the distance j between intensity centers 631-2a and 632-2a, and the distance k between intensity centers 632-2a and 631-3a, are each equal to 1.

FIG. 6C further illustrates that when the intensity centers are equidistant from each other, any point located within a given unit cell that is not located at an edge of the sensor array is no more than approximately $\sqrt{3}/3$ times a height of the unit cell away from a nearest intensity center. For example, the point 640 cannot be moved farther away from any of the intensity centers 631-2a, 631-3a, or 632-2a without moving closer to another of the intensity centers. When the height of the unit cells is equal to 1, the distances i, j, and k are all equal to 1; thus, the distance from point 640 to any of the three intensity centers can be determined as a centroid calculation for an equilateral triangle having a height of $\sqrt{3}/2$. The distance between point 640 and any of the intensity centers is therefore $2/3 \times \sqrt{3}/2$, or $\sqrt{3}/2$.

As compared to a non-offset sensor pattern having similar unit cell dimensions, embodiments of the offset sensor pattern as described above have a shorter maximum distance between any point in a non-edge unit cell and the nearest high touch intensity center. Accordingly, the most sensitive areas of the sensor (i.e, the high touch intensity centers) are more evenly distributed over the surface of the sensor array. This in turn results in greater signal uniformity and more robust touch detection.

Figure 7A:
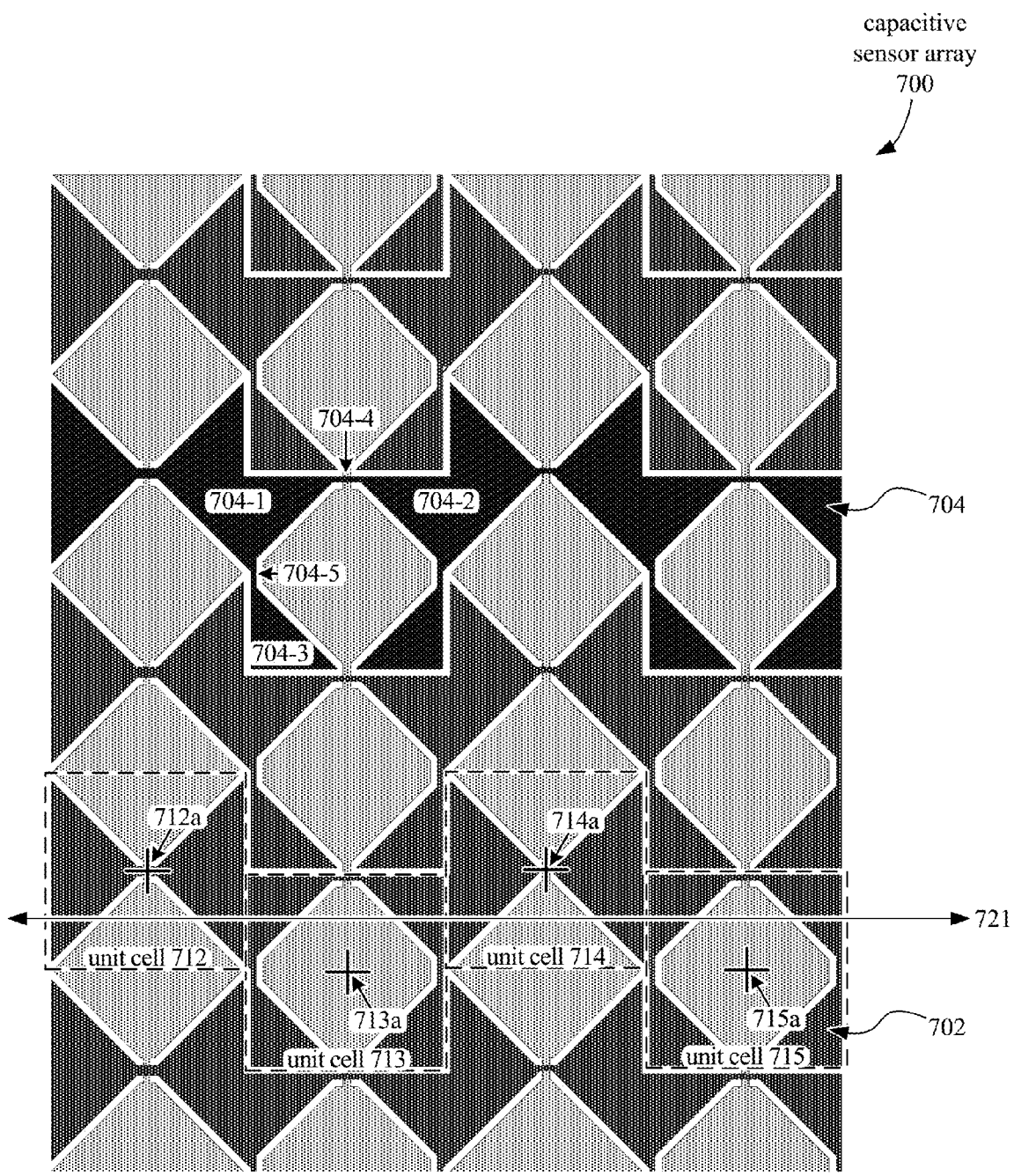
FIG. 7A illustrates a capacitive sensor array having a diamond pattern with offset unit cells, according to an embodiment.

In one embodiment, the unit cell layout principles and proportions as described with respect to the previous figures, such as FIGS. 6B and 6C, for example, can be applied to capacitive sensor array 700 having a diamond pattern as illustrated in FIG. 7A. Thus, in one embodiment, capacitive sensor array 700 includes row and column sensor electrodes forming unit cells that are each offset relative to unit cells in adjacent columns, where such unit cells may have similar proportions as the unit cells as described with respect to FIGS. 6A and 6B.

As illustrated in FIG. 7A, the row sensor electrode 702 is associated with unit cells 712, 713, 714, and 715, which have high touch intensity centers 712a, 713a, 714a, and 715a, respectively. In sensor array 700, alternating columns of unit cells are offset; thus, unit cells 712 and 714 are offset relative to unit cells 713 and 715. In one embodiment, the high touch intensity centers 712a, 713a, 714a, and 715a are located at the centers of their respective unit cells and are staggered on alternating lateral sides of a medial longitudinal axis 721 that extends the length of the sensor electrode 702 and divides the area of the electrode 702 into equal parts.

In one embodiment, each of the row sensor electrodes in the capacitive sensor array 700 may include multiple subelements that are electrically coupled together by connecting traces. For example, the sensor electrode 704 includes multiple subelements, such as 704-1, 704-2, and 704-3. Subelement 704-1 is electrically connected to its nearest adjacent subelements 704-2 and 704-3 by connecting traces 704-4 and 704-5, respectively. In one embodiment, each of the connecting traces, such as traces 704-4 and 704-5, is less wide than any of the subelements, such as subelements 704-1, 704-2, and 704-3.

In one embodiment, one or more of the subelements may extend away from a main trace of the sensor electrode, where the main trace for a sensor electrode may correspond to the shortest conductive path from one end of the electrode to the opposite end. For example, the subelectrode 704-3 extends away from the main trace of sensor electrode 704.

In one embodiment, the centroid of a given subelement and the centroid of one of the nearest adjacent subelements to the given subelement may be positioned on opposite lateral sides of a medial longitudinal axis of the row sensor electrode. For example, the centroids of subelements 704-1 and 704-3 are located on opposite sides of a medial longitudinal axis of sensor electrode 704.

In one embodiment, the area of the row sensor electrode contained in one unit cell may be substantially the same as the area of the row sensor electrode contained in an adjacent unit cell, while the shapes of the areas are different. For example, the area of the row sensor electrode 702 that is contained in unit cell 712 is substantially equal to the area of the row sensor electrode 702 that is contained in the adjacent unit cell 713. The portion of the row sensor electrode 702 that is contained within unit cell 712 is a different shape than the portion of row sensor electrode 702 that is contained within unit cell 713.

Figure 7B:
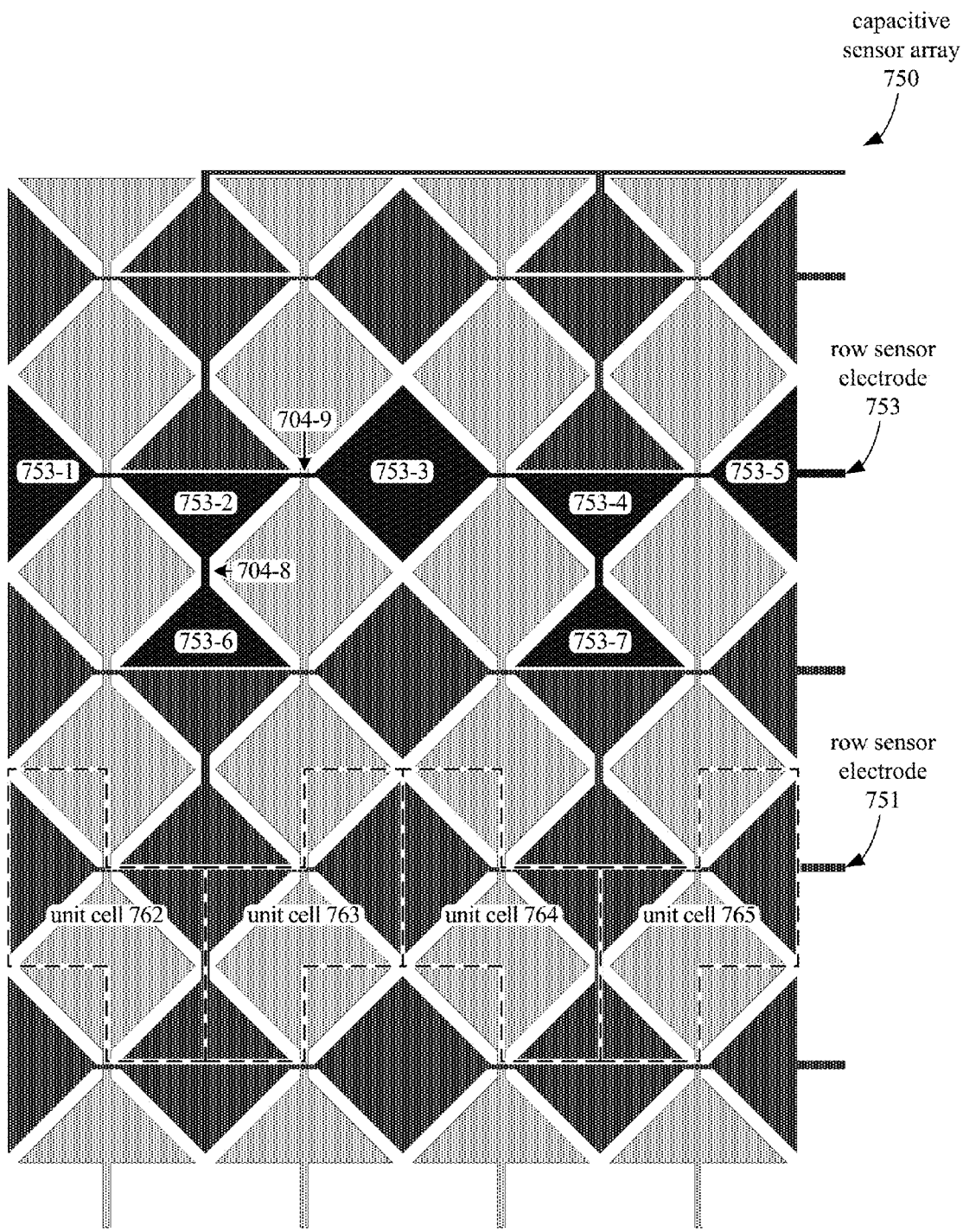
FIG. 7B illustrates a capacitive sensor array having a diamond pattern with offset half-cells, according to an embodiment.

FIG. 7B illustrates an embodiment of a capacitive sensor array 750 having a diamond pattern, where each half of each unit cell is offset with respect to the other half of the same unit cell. As compared to the diamond pattern of sensor array 700 illustrated in FIG. 7A, the area of the diamond shapes making up the row sensor electrodes in the sensor array 750 are divided differently between row sensor electrodes.

In one embodiment, each unit cell in sensor array 750 may be a non-rectangular shape; for example, each of the unit cells 762, 763, 764, and 765 associated with the row sensor electrode 751 is in a shape that is the union of two offset rectangles, where each of the rectangles includes half the area of the unit cell.

In one embodiment, each of the row sensor electrodes in the capacitive sensor array 750 may include multiple subelements that are electrically coupled together by connecting traces. For example, the sensor electrode 753 includes multiple subelements, such as 753-1, 753-2, 753-3, 753-4, and 753-5, which are electrically connected to each other in said order by connecting traces, such as trace 704-9. The row sensor electrode 753 may also include subelements that branch away from a main trace of the electrode 753. The subelements 753-6 and 753-7 branch away from the main trace of electrode 753 and are electrically coupled with subelements 753-2 and 753-4, respectively, by connecting traces. For example, subelement 753-6 is electrically coupled with subelement 753-2 via connecting trace 704-8.

Figure 8:
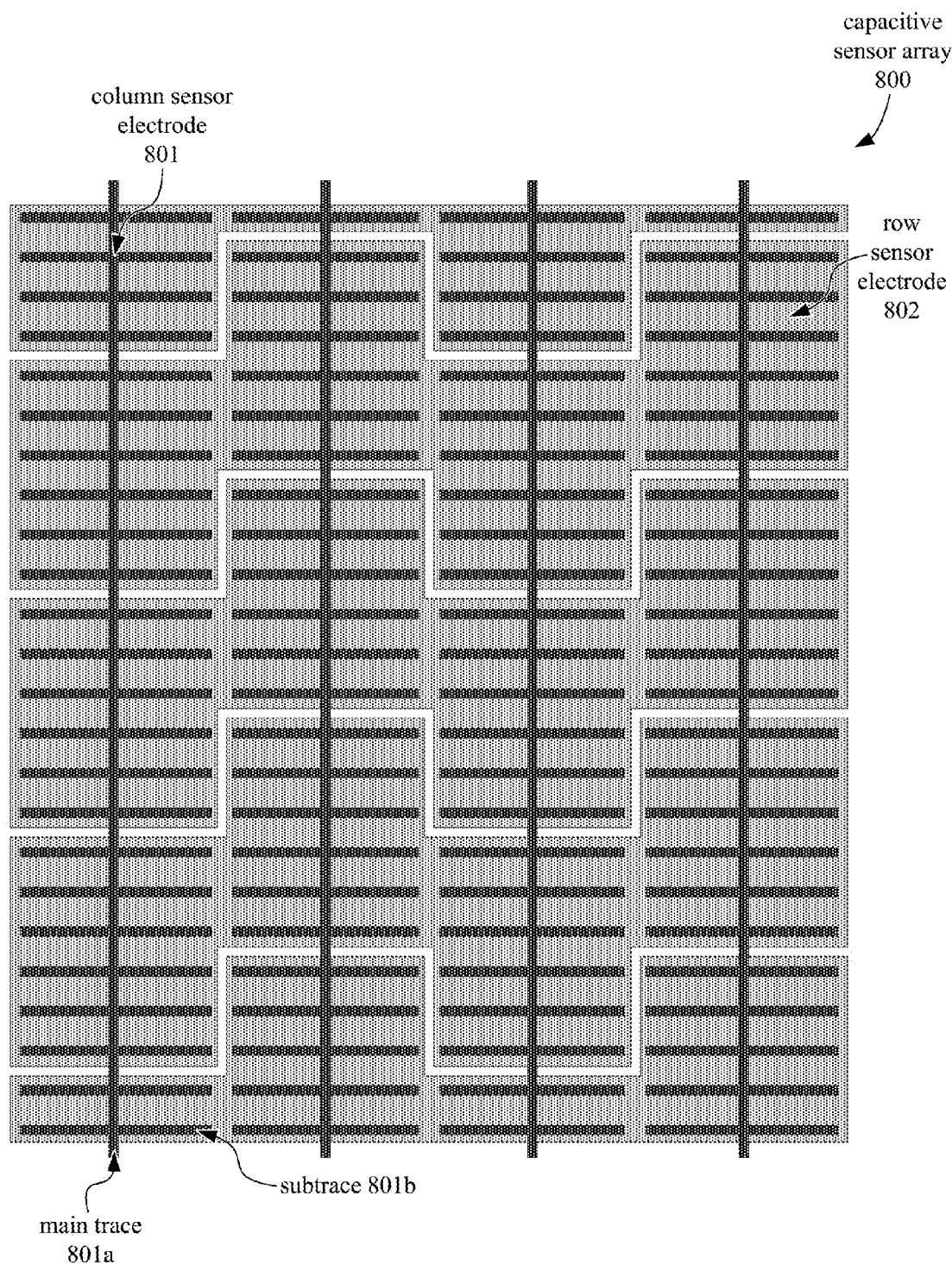
FIG. 8 illustrates an embodiment of a capacitive sensor array having an offset cell pattern.

In one embodiment, the unit cell layout principles and proportions as described with respect to the previous figures, such as FIGS. 6B and 6C, for example, can be applied to capacitive sensor array 800 as illustrated in FIG. 8. Thus, in one embodiment, capacitive sensor array 800 includes row and column sensor electrodes forming unit cells that are each offset relative to unit cells in adjacent columns, where such unit cells may have similar proportions as the unit cells as described with respect to FIGS. 6A and 6B.

In one embodiment, the column sensor electrodes of capacitive sensor array 800 each include a main trace extending the length of the column sensor electrode and multiple subtraces each extending away from the main trace. For example, column sensor electrode 801 includes a main trace 801a with multiple subtraces, such as subtrace 801b, extending away from the main trace 801a.

In one embodiment, the row and column sensor electrodes of the sensor array 800 are formed from different layers of conductive material. As illustrated in FIG. 8, for example, the row sensor electrode 802 is formed from a different layer of conductive material than the column sensor electrode 801. Additionally, the surface area of the sensor array 800 is substantially covered by the row sensor electrodes collectively.

Figure 9A:
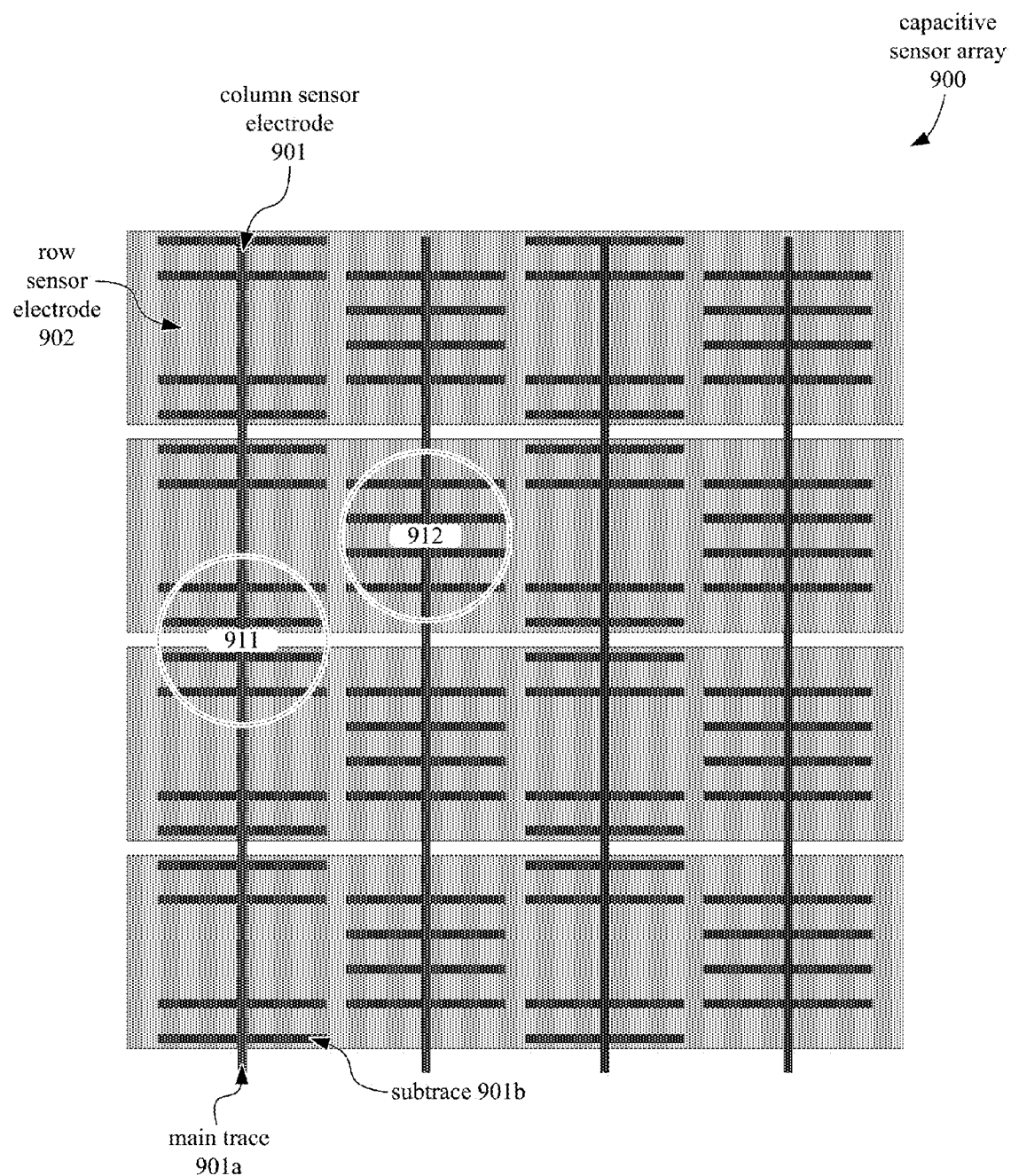
FIG. 9A illustrates an embodiment of a capacitive sensor array having a offset intensity center pattern.

FIG. 9A illustrates an embodiment of a capacitive sensor array 900 having high touch intensity centers that do not always correspond to the centers of the unit cells. Similar to the sensor array 800 illustrated in FIG. 8, the column sensor electrodes of sensor array 900 include a main trace and multiple subtraces extending away from the main trace. For example, column sensor electrode 901 includes a main trace 901a and multiple subtraces, such as subtrace 901b, extending away from the main trace 901a.

In capacitive sensor array 900, the sensor electrodes may include regions of increased sensitivity corresponding to regions of higher trace density, characterized by a greater trace edge length contained within a given area. For example, regions 911 and 912 are regions where the density of subtraces is greater than surrounding regions. Since the regions having higher trace density are not necessarily at the centers of the unit cells, their corresponding high intensity touch centers are also not necessarily at the centers of the unit cells.

Figure 9B:
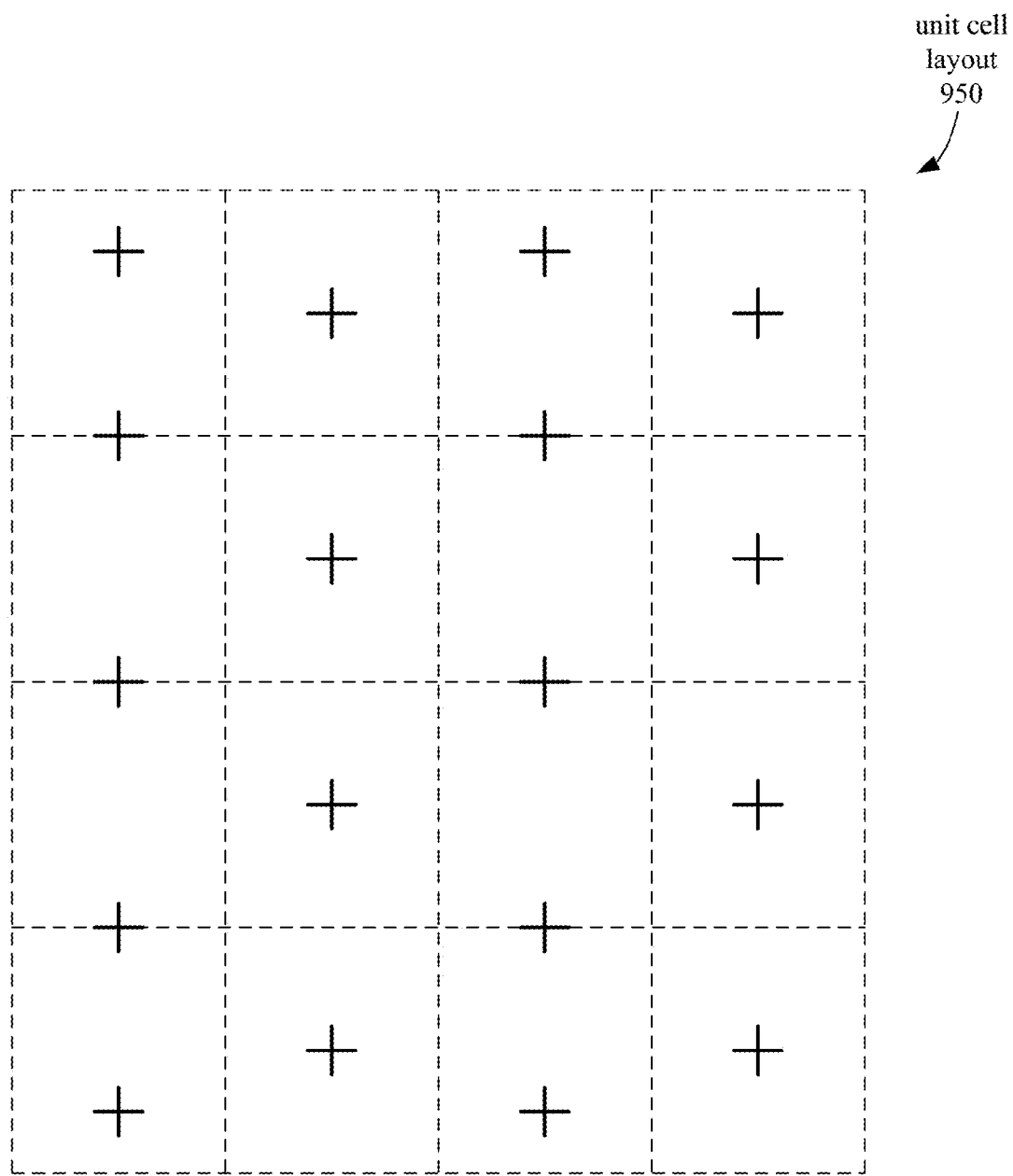
FIG. 9B illustrates a layout of unit cells for a capacitive sensor array having an offset intensity center pattern, according to an embodiment.

FIG. 9B illustrates the layout 950 of unit cells and high touch intensity centers corresponding to the sensor array 900. As illustrated in FIG. 9B, the unit cells of the capacitive sensor array 900 may be arranged in a grid while the intensity centers are arranged in an offset pattern. In one embodiment, this staggered arrangement of the intensity centers may be used to improve the uniformity of touch sensitivity over the active surface area of the sensor array 900, as compared to a sensor array with intensity centers that are not staggered. In one embodiment, the sensor array 900 may include one or more intensity centers, particularly away from the edge of the sensor array 900, that are substantially equidistant from the nearest six intensity centers.

In one embodiment, the unit cells in the layout 950 may be proportioned as previously described with regard to FIGS. 6B and 6C, even though the unit cells themselves are not offset.

While the various embodiments as described herein have been described with respect to capacitive touch-sensing applications, the same principles may be used to improve the resolution and signal uniformity of other types of sensor arrays. For example, the rows or columns of pixels in an image sensor array, such as those in digital cameras, may also benefit from an offset grid design.

In the foregoing embodiments, various modifications can be made; for example, row sensor electrodes and column sensor electrodes may be interchanged, and row or column sensor electrodes may be used as either TX or RX sensor electrodes. Furthermore, in some embodiments, intersections between row and column sensor electrodes may be replaced with conductive bridges. For example, bridges may be used to electrically connect portions of sensor electrodes when both row and column sensor electrodes are constructed from a single layer of conductive material. As described herein, conductive electrodes that are "electrically connected" or "electrically coupled" may be coupled such that a relatively low resistance conductive path exists between the conductive electrodes. The terms "substantially" and "approximately" may indicate values or characteristics that may deviate from a nominal value or ideal characteristic (where such deviation may result from manufacturing tolerances, rounding error, and the like) while the desired effect of the nominal value or ideal characteristic is preserved.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A capacitive sensor array, comprising:
   a first plurality of column sensor electrodes, wherein for each column sensor electrode of the plurality of column sensor electrodes, the column sensor electrode comprises a main trace extending a length of the column sensor electrode; and
   a second plurality of row sensor electrodes, wherein each of the first plurality of column sensor electrodes is capacitively coupled with at least two of the second plurality of row sensor electrodes to form a plurality of unit cells, wherein for each unit cell of the plurality of unit cells, the unit cell is associated with a unique pairing of one of the row sensor electrodes and one of the column sensor electrodes, and the unit cell includes an intensity center located at a point of greatest capacitance sensitivity between the row electrode and the column electrode of the unique pairing, wherein for each row sensor electrode of the plurality of row sensor electrodes, the row sensor electrode comprises a plurality of electrically connected portions each within a different one of the plurality of unit cells, wherein a first portion of the plurality of portions has a different shape than a second portion of the plurality of portions, wherein an axis of the row sensor electrode crosses each of the electrically connected portions of the row sensor electrode, wherein the intensity centers associated with the electrically connected portions of the row sensor electrode are staggered on alternating sides of the axis, and wherein for each unit cell of the plurality of unit cells, a distance between the intensity center of the unit cell and a nearest intensity center of another unit cell that is located at a perimeter of the unit cell is at least 0.7 times a height of the unit cell, wherein the height of the unit cell is measured in a direction of the axis of the column sensor electrode associated with the unit cell.

2. The capacitive sensor array of claim 1, wherein for each unit cell of the plurality of unit cells, a first distance between the intensity center of the unit cell and a first intensity center of a first other unit cell at the perimeter of the unit cell is substantially equal to a second distance between the intensity center of the unit cell and a second intensity center of a second other unit cell that is at the perimeter of the unit cell and that is adjacent to the first other unit cell.

3. The capacitive sensor array of claim 1, wherein for each unit cell of the plurality of unit cells, a ratio of the height of the unit cell to a width of the unit cell is substantially equal to $1: \sqrt{3}/2$.

4. The capacitive sensor array of claim 1, wherein for each unit cell of the plurality of unit cells that is not located at an edge of the capacitive sensor array, any point located within the unit cell is no more than $\sqrt{3}/3$ times a height of the unit cell away from a nearest intensity center.

5. The capacitive sensor array of claim 1, wherein for each unit cell, the intensity center of the unit cell is offset relative to a nearest intensity center of a unit cell of an adjacent column sensor electrode, wherein a component of the offset in a direction along an axis of the column sensor electrode of the unit cell is substantially equal to half the height of the unit cell.

6. The capacitive sensor array of claim 1, wherein at least one of the plurality of unit cells located at an edge of the capacitive sensor array is smaller than any of the plurality of unit cells not located at the edge of the capacitive sensor array.

7. The capacitive sensor array of claim 1, wherein the axis of each of the row sensor electrodes is substantially perpendicular to an axis of at least one of the plurality of column sensor electrodes.

8. The capacitive sensor array of claim 1, wherein for each unit cell of the plurality of unit cells, each point within the unit cell is nearer to a boundary between the row sensor electrode and the column sensor electrode of the unique pairing associated with the unit cell than to a boundary between any other pairing of a row sensor electrode and a column sensor electrode, and the intensity center of the unit cell is located substantially at a centroid location of the unit cell.

9. The capacitive sensor array of claim 1, wherein the first plurality of column sensor electrodes and the second plurality of row sensor electrodes are formed from a single layer of conductive material, and wherein each of the column sensor electrodes comprises a plurality of subtraces interleaved with subtraces of one or more of the plurality of row sensor electrodes.

10. A capacitance sensing system, comprising:
    a capacitance sensor;
    a first plurality of column sensor electrodes of a capacitive sensor array coupled with the capacitance sensor, wherein for each column sensor electrode of the plurality of column sensor electrodes, the column sensor electrode comprises a main trace extending a length of the column sensor electrode;
    a second plurality of row sensor electrodes of the capacitive sensor array, wherein each of the first plurality of column sensor electrodes is capacitively coupled with at least two of the second plurality of row sensor electrodes to form a plurality of unit cells, wherein for each unit cell of the plurality of unit cells, the unit cell is associated with a unique pairing of one of the row sensor electrodes and one of the column sensor electrodes, and the unit cell includes an intensity center located at a point of greatest capacitance sensitivity between the row electrode and the column electrode of the unique pairing, wherein for each row sensor electrode of the plurality of row sensor electrodes, the row sensor electrode comprises a plurality of electrically connected portions each within a different one of the plurality of unit cells, wherein a first portion of the plurality of portions has a different shape than a second portion of the plurality of portions, wherein an axis of the row sensor electrode crosses at each of the electrically connected portions of the row sensor electrode, wherein the intensity centers associated with the electrically connected portions of the row sensor electrode are staggered on alternating sides of the axis, and wherein for each unit cell of the plurality of unit cells, a distance between the intensity center of the unit cell and a nearest intensity center of another unit cell that is located at a perimeter of the unit cell is at least 0.7 times the height of the unit cell, wherein the height of the unit cell is measured in the direction of the axis of the column sensor electrode associated with the unit cell.

11. The capacitance sensing system of claim 10, wherein for each unit cell of the plurality of unit cells, a first distance between the intensity center of the unit cell and a first intensity center of a first other unit cell at the perimeter of the unit cell is substantially equal to a second distance between the intensity center of the unit cell and a second intensity center of a second other unit cell that is at the perimeter of the unit cell and that is adjacent to the first other unit cell, and the ratio of a height of the unit cell to the width of the unit cell is substantially equal to 1: $\sqrt{3}/2$.

12. The capacitance sensing system of claim 10, wherein for each unit cell of the plurality of unit cells, the capacitance sensor is configured to measure a mutual capacitance between the row sensor electrode and the column sensor electrode associated with the unit cell.

* * * * *